United States Patent [19]

Kanehori et al.

[11] Patent Number: 4,572,873
[45] Date of Patent: Feb. 25, 1986

[54] TITANIUM DISULFIDE THIN FILM AND PROCESS FOR FABRICATING THE SAME

[75] Inventors: Keiichi Kanehori, Sayama; Katsuki Miyauchi, Hino; Tetsuichi Kudo, Tokyo, all of Japan

[73] Assignee: Hitachi, Ltd., Tokyo, Japan

[21] Appl. No.: 702,661

[22] Filed: Feb. 19, 1985

Related U.S. Application Data

[63] Continuation of Ser. No. 531,706, Sep. 13, 1983, abandoned.

[30] Foreign Application Priority Data

Sep. 13, 1982 [JP]  Japan .................... 57-158123

[51] Int. Cl.$^4$ .................... B32B 9/00; B32B 17/06
[52] U.S. Cl. .................... 428/432; 427/126.1; 427/255; 427/255.1; 428/698; 428/701
[58] Field of Search .................... 427/255, 255.1, 255.2, 427/126.1, 126.2, 419.7; 428/698, 426, 432, 411, 446, 701; 423/561 R

[56] References Cited

U.S. PATENT DOCUMENTS

| 4,007,055 | 2/1977 | Whittingham | 423/561 R |
| 4,058,430 | 11/1977 | Suntola et al. | 427/255.2 |
| 4,203,861 | 5/1980 | Thorp et al. | 423/88 |
| 4,259,310 | 3/1981 | Clapper | 423/561 R |
| 4,337,239 | 6/1982 | Ruhs et al. | 423/561 R |
| 4,364,995 | 12/1982 | Crawford et al. | 428/698 |

OTHER PUBLICATIONS

Pessa et al., "Characterization of Surface Exchange Readings Used to Grow Compound Films", Appl. Phys. Lett., vol. 38, pp. 131-132, Feb. 1981.

Primary Examiner—S. L. Childs
Attorney, Agent, or Firm—Antonelli, Terry & Wands

[57]  ABSTRACT

The present invention relates to a titanium disulfide film fabricated on a substrate, where crystallites of titanium disulfide is oriented at an angle of their c-axis to the substrate surface of not more than 45°, and to a process for fabricating the film, where the film is prepared by chemical vapor deposition from $TiCl_4$ and $H_2S$ as source gases under an inner pressure of reaction tube of 30 kPa or less.

15 Claims, 6 Drawing Figures

TITANIUM DISULFIDE THIN FILM AND PROCESS FOR FABRICATING THE SAME

This is a continuation of application Ser. No. 531,706 filed Sept. 13, 1983, now abandoned.

BACKGROUND OF THE INVENTION

This invention relates to a $TiS_2$ film and a process for fabricating the same, and particularly to a flat and dense $TiS_2$ film suitable for the cathode film of a thin film lithium secondary battery and a process for fabricating the same.

Recently, a desire for miniaturizing batteries as electric sources for electronic appliances has become keen with the miniaturization of the electronic appliances. An example of the art meeting this desire is a thin film lithium battery whose constituents, i.e. cathode, electrolyte and anode are all prepared only according to the thin film process. The thin film lithium battery has a thickness as small as about 100 μm, which is considerably smaller than that of the conventional small battery usually having a thickness of about 1 mm. Furthermore, when a rechargeable thin film lithium battery can be made, a low discharge capacity, which is an inherent disadvantage of the thin film battery, can be overcome.

In fabricating a cathode film of thin film lithium battery it is necessary that its surface be flat and dense. That is, when the surface of a cathode film 2 has sharp projections 5 in forming the cathode film 2 on a substrate 1, as shown in FIG. 1, the cathode film 2 cannot be completely covered by an electrolyte film 3, and cathodes are locally exposed. Thus, when an anode film 4 is formed on the electrolyte film 3, there are short-circuits with the projections of cathode, with a failure to work as a battery.

According to studies of lithium secondary batteries so far made (for example, U.S. Pat. No. 4,203,861), it is known that $TiS_2$ is a promising cathode material. However, the conventional batteries are prepared by bringing a cathode molding into contact of an electrolyte in a liquid state or in a pressed powder state, and no flat and dense surface is required for the cathode molding. And in fact a cathode molding in a pressed powder state with a low density and a considerable irregularity has been used.

As described above, neither a flat and dense $TiS_2$ film applicable for a cathode film of thin film lithium battery nor a process for fabricating the same has been found yet.

SUMMARY OF THE INVENTION

An object of the present invention is to provide a flat and dense $TiS_2$ film and a process for fabricating the same.

This and other objects can be attained by a titanium disulfide film fabricated on a substrate, which comprises crystallites of titanium disulfide being oriented at an angle of their c-axis to the substrate surface of not more than 45° on average, and also by a process for fabricating the same. $TiS_2$ can be synthesized by chemical vapor deposition (CVD) using $H_2S$ and $TiCl_4$ as source gases according to the following reaction:

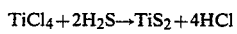

This reaction itself is known from U.S. Pat. No. 4,203,861, but this process is not applicable to deposition of $TiS_2$ film on a substrate material as placed in a reaction tube. That is, according to this process, $TiS_2$ powders are formed in a gas phase, and tend to settle down only for accumulation. Thus, it is necessary to collect the accumulated powders and press them as cathodes.

Some of the present inventors had already studied the ratio of $TiCl_4/H_2S$ and substrate temperature, and had found a process for directly forming a $TiS_2$ film on a substrate, but it was found that this process could not produce a $TiS_2$ film with a high density and a good flatness.

Thus, the present inventors have made further studies of reaction conditions of CVD process and have found optimum conditions for the inner pressure of a reaction system, reaction temperature, reaction gas composition, etc. and have established the present invention.

The theoretical energy density (discharge capacity) of titanium disulfide is set by the following reaction and is 0.78 A h/cm³.

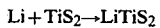

Thus, in fabricating a titanium disulfide film having 100% density on a substrate of 1 cm², an energy density will be 78 μAh per thickness of 1 μm.

On the other hand, with lower power consumption of electronic applicances, for example, IC memory, some of IC memories of all CMOS type has a current consumption of about 1 μA, but most of them generally have a current consumption of about 5–10 μA. A battery, when formed on these IC memories, can have an available area of about 5 mm×5 mm. Thus, a current consumption will be about 4–40 μA/cm², and a discharge capacity for backup of the memories for 24 hours with this current consumption will be 100–1,000 μAh.

As described above, a considerable discharge is possible even with a thin film, but it is better with a thicker film. The thickness of a film is practically at least 1 μm, preferably at least 10 μm.

The film density of a titanium disulfide film has an influence upon its discharge capacity, current density, evenness of current and contactibility to an electrolyte film. For example, if a density is presumed to be 70% throughout, an apparent current density will be 1.4 times as high as that at 100% density, and reduction in battery voltage due to the discharge becomes considerable with increasing current density. And particularly at the initial stage the reduction in voltage is proportional to the second power of current density. That is, when the current density becomes 1.4 times as high, the reduction in voltage will be doubled. Other influences will give adverse effects on the battery characteristics with lowering density.

Thus, the film density must be desirably at least 70%, preferably at least 85%.

In preparing a battery by forming a solid electrolyte film and a Li film on the titanium disulfide film, the flatness of titanium disulfide as the underlayer is a problem. When a titanium disulfide film has a projection, an electrolyte film becomes extremely thin at the projection, with a possibility of short-circuit when used as a battery. Thus, when a titanium disulfide film has a difference in level on the surface, the difference must be desirably less than 0.5 μm, preferably less than 0.2 μm, from the level of average film thickness.

The structure of titanium disulfide crystal belongs to a hexagonal system, and its c-axis is orthogonal to the S-face. When the direction of S-S layer of titanium disulfide is in agreement with the flow of $Li^+$ in the structure of a battery, a high power discharge is possible because of good diffusion of $Li^+$. Thus, it is preferable that the c-axis of crystalline of titanium disulfide, that is, the axis orthogonal to the S-face be oriented at an angle of not more than 45°, preferably, not more than 30°, on average, with respect to the substrate surface.

In this connection, the following three cases will be investigated: (i) case that the c-axis of crystallite is oriented in parallel to the substrate surface, (ii) case that the c-axis is oriented orthogonal to the substrate surface, and (iii) the c-axis is oriented at a degree of 45° with respect to the substrate surface.

The chemical diffusion coefficient of $Li^+$ in the titanium disulfide lattice is anisotropic. The chemical diffusion coefficient of $Li^+$ in the direction orthogonal to the c-axis, that is, between the S-S layers orthogonal to the c-axis, is as large as up to $10^{-8}$ cm$^2$/s; whereas the chemical diffusion coefficient in the direction of c-axis is by four orders as small as $10^{-12}$ cm$^2$/s. Thus, among three orientations, the case (i) can produce much current density because the direction of large chemical diffusion coefficient of $Li^+$ is in agreement with the flow direction of $Li^+$ when a battery is prepared. The case (ii) cannot produce much current density, because the direction of small chemical diffusion coefficient of $Li^+$ is in agreement with the flow direction of $Li^+$ when a battery is prepared. The case (iii) is an intermediate between the cases (i) and (ii), and both readily $Li^+$-diffusible face and hardly $Li^+$-diffusible face appear on the surface, where it seems that $Li^+$ preferentially flows in the direction orthogonal to the c-axis, and thus apparent current density increases on each crystallite. This effect is more pronounced with increasing angle—between the c-axis and the substrate surface, and thus it is preferable that this angle be smaller.

It is also preferable that the size of crystallite be such that each crystallite continues from the substrate surface to the film surface. Such titanium disulfide film can be formed by CVD process using $TiCl_4$ and $H_2S$ as source gases under an inner pressure of reaction system of 0.001-30 kPa, preferably 0.1-30 kPa, and a substrate temperature of 350°-650° C., preferably 350°-600° C., more preferably 420°-550° C. Concentration ratio (molar ratio) of $H_2S/TiCl_4$ is preferably 3-20, and a carrier gas is preferably He, Ar, etc. The present invention will be described in detail below, referring to examples and drawings.

DETAILED DESCRIPTION OF PREFERRED EMBODIMENTS

EXAMPLE 1

Figure 1:
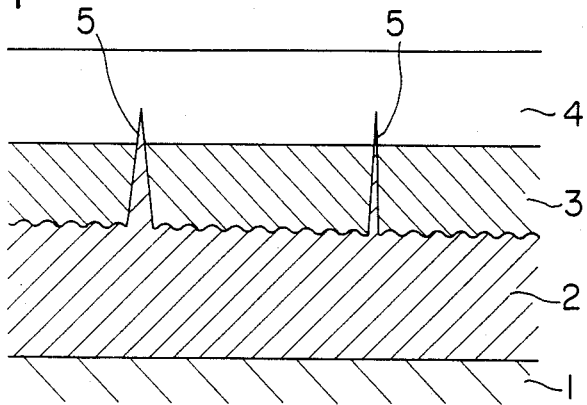
FIG. 1 is a partial cross-sectional view of a thin film lithium battery.
Figure 2:
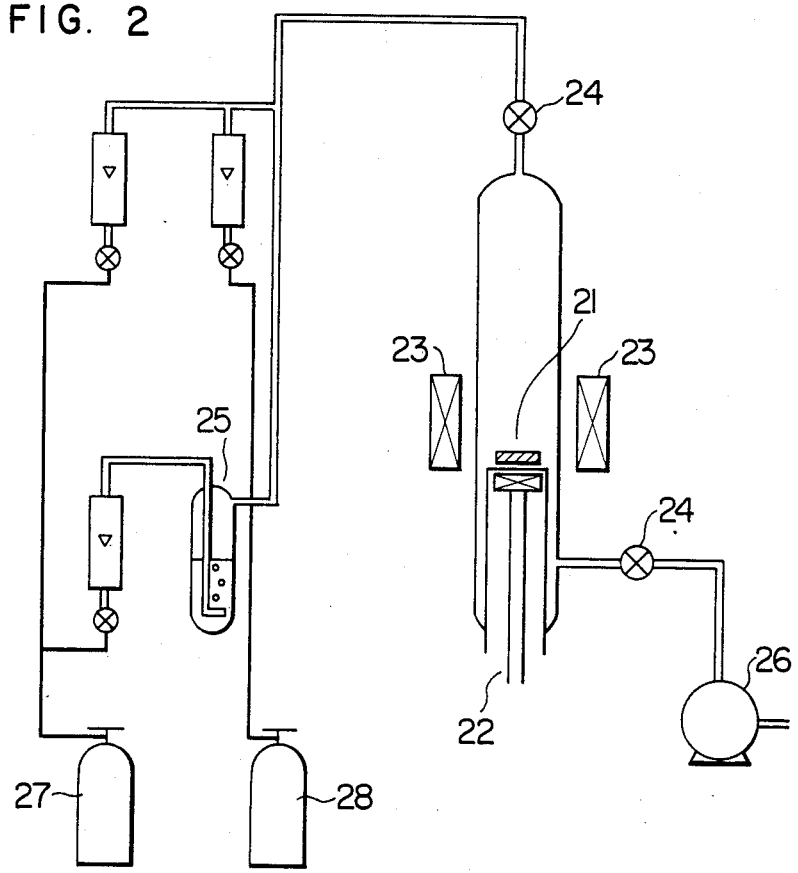
FIG. 2 is a schematical view of an apparatus used for the present invention.

In FIG. 2 a CVD apparatus used in the present invention is shown.

As shown in FIG. 2, a carrier gas 27 was introduced into a $TiCl_4$ bubbler 25 to prepare a $TiCl_4$-containing gas. The $TiCl_4$-containing gas was mixed with a $H_2S$ carrier gas 28 to prepare a source gas. The source gas passed through a reaction tube under aspiration by a vacuum pump 26. The inner pressure of the reaction tube was controlled by two upstream and downstream needle valves 24, and measured by a mercury manometer. A substrate 21 in the reaction tube was heated by a bottom heater 22 and side heaters 23.

CVD was carried out with the apparatus of FIG. 2 while keeping the temperature of quartz substrate 21 (20 mm in diameter, 1 mm thick) at 500° C., a $TiCl_4$ flow rate at 2.3 μl/s, a $H_2S$ flow rate at 40 μl/s, and a $N_2$ flow rate at 1.3 ml/s, whereas varying the inner pressure of reaction tube between 0.1-35 kPa.

The surface and cross-section of the $TiS_2$ films having a film thickness of about 3 μm thus fabricated were observed by a scanning electron microscope. The films prepared under an inner pressure of not more than 30 kPa had a flat surface and a density of about 70% or more. The c-axis of crystallites of the films were oriented at angles of about 0° to about 45° with respect to the substrate surface, and most of crystallites were single crystals growing from the substrate surface to the film surface. The flatness, density and orientation of the films were particularly better at an inner pressure of 1.5 kPa or less within the said inner pressure range.

On the other hand, the films prepared under the inner pressure of 35 kPa, very large crystals were contained in the films, making the film surfaces irregular, and the orientation of crystallite was at random, as compared with that of the films prepared under an inner pressure of 30 kPa or less.

Figure 3:
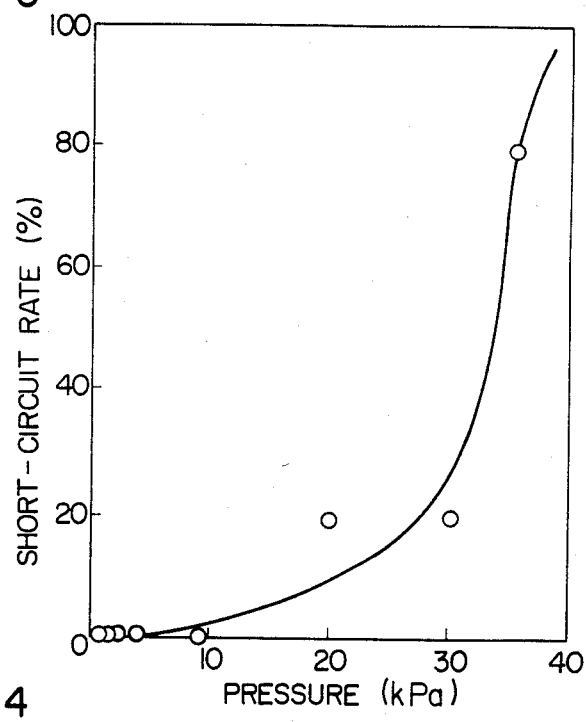
FIG. 3 is a diagram showing a relationship between an inner pressure of a reaction system when a $TiS_2$ film is fabricated and a short-circuit rate when a thin film lithium battery is prepared thereon.

Then, a film having a composition of $Li_{3.6}Si_{0.6}P_{0.4}O_4$ (film thickness: about 1 μm) was formed on the $TiS_2$ film as an electrolyte film and 5 Li dot films (film thickness: about 3 μm; diameter: 2 mm) were formed on the electrolyte film to prepare 5 model film batteries. The batteries prepared from the $TiS_2$ films fabricated under an inner pressure of reaction tube of 10 kPa or less had no short-circuit at all, as shown in FIG. 3, and one each of the batteries prepared from the $TiS_2$ films formed at 20 kPa and 30 kPa, respectively, had a short-circuit. On the other hand, among five $TiS_2$ films prepared at 35 kPa, four had short-circuits. That is, only when the $TiS_2$ films had a flat surface, that is, only when the films were fabricated at 30 kPa or less, a thin film battery could be prepared with a good efficiency.

Figure 4:
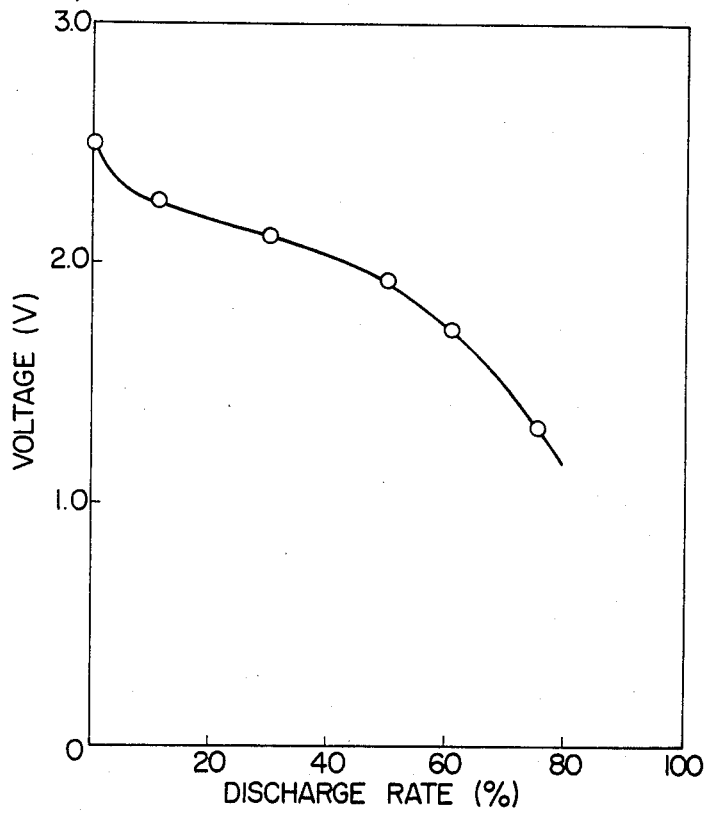
FIG. 4 is a diagram showing a discharge curve of the thus prepared thin film lithium battery.

A battery prepared from a $TiS_2$ film fabricated under the inner pressure of reaction tube of 9 kPa had an open circuit voltage of about 2.5 V, and had a discharge curve at a constant current discharge of 5 μA/cm$^2$, as shown in FIG. 4, where a high discharge rate was obtained.

To obtain a $TiS_2$ film which is so flat and dense as to be utilizable as a cathode film of a thin film lithium battery and whose crystallite is oriented at an angle of its c-axis to the substrate surface of 45° or less, it is necessary that the inner pressure of a reaction system is 30 kPa or less, preferably 1.5 kPa or less, as in the present invention as shown above.

In this example, $N_2$ was used as the carrier gas, but it is desirable to use a noble gas such as He or Ar in place of $N_2$, because no titanium nitride is formed.

EXAMPLE 2

CVD was carried out with the same apparatus as used in Example 1, while keeping a $TiCl_4$ flow rate at 2.3 $\mu l/s$, a $H_2S$ flow rate at 45 $\mu l/s$, a He flow rate at 1.3 ml/s, and an inner pressure of reaction tube at 9 kPa, whereas varying a substrate temperature between 300°–700° C.

The $TiS_2$ films fabricated at a substrate temperature of 350°–650° C. had a flat surface and a density of about 70% or higher, and their crystallites were oriented at an angle of its c-axis to the substrate surface of 45° or less, whereas the $TiS_2$ films formed at 700° C. had a similar structure to that in which crystallates grow at random, that is, they had a disturbed orientation and pronounced surface irregularity. At a substrate temperature of 300° C., the growth rate of the film was considerably low. Better flatness, density and orientation of films were obtained in a temperature range of 420°–600° C., particularly 450°–550° C.

Figure 5:
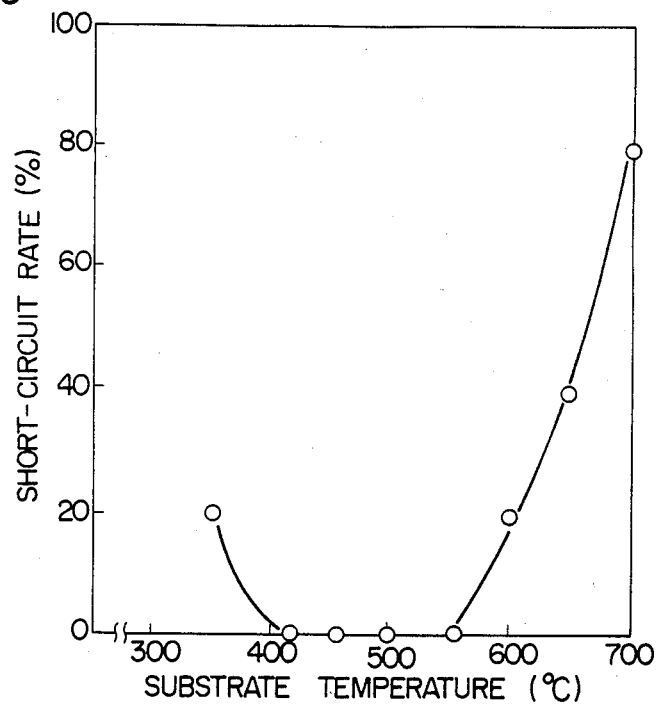
FIG. 5 is a diagram showing a relationship between a substrate temperature and a short-circuit rate.

Then, model film batteries were prepared in the same manner as in Example 1. The batteries prepared from the $TiS_2$ films fabricated at 420°–550° C. had no short-circuits at all, as shown in FIG. 5, whereas only one each of the batteries prepared from the $TiS_2$ films formed at 350° C. and 600° C. had a short-circuit, and only two of the batteries prepared from the $TiS_2$ film formed at 650° C. had a short-circuit. On the other hand, among five batteries prepared from the $TiS_2$ film formed at 700° C., four had a short-circuit.

To obtain a flat and dense $TiS_2$ film whose crystallites are oriented at an angle of its c-axis to the substrate surface of 45° or less, it is necessary that the substrate temperature be 350°–650°, preferably 420°–600° C., more preferably 450°–550° C., as in the present invention as described above.

EXAMPLE 3

CVD was carried out with the same apparatus as in Example 1, while keeping the substrate temperature at 350° C. and 650° C., respectively, and the inner pressure of reaction tube at 30 kPa. The $TiCl_4$ flow rate was 2.3 $\mu l/s$, the $H_2S$ flow rate 45 $\mu l/s$, and the He flow rate 1.3 ml/s.

The thus obtained two $TiS_2$ films had somewhat poor flatness, density and orientation as compared with those of the film fabricated at the inner pressure of reaction tube of 10 kPa, but had an angle of the c-axis to the substrate surface of about 45°, and a density of about 70%. When batteries were prepared in the same manner as in Example 1, only two each of five batteries had a short-circuit.

As described above, a $TiS_2$ film having a flat surface, a density of about 70% and an angle of the c-axis to the substrate surface of about 45° can be obtained by keeping the substrate temperature in a range of 350° to 650° C. though the inner pressure of reaction tube is increased to 30 kPa.

EXAMPLE 4

CVD was carried out with the same apparatus as in Example 1, while keeping the substrate temperature at 500° C., the inner pressure of reaction tube at 3 kPa, sum of the $TiCl_4$ flow rate and $H_2S$ flow rate at 50 $\mu l/s$, and the He flow rate at 5 ml/s, whereas varying a concentration ratio of $H_2S/TiCl_4$ to 2–40.

As to the orientation of crystallites, a tendency to slightly increase an angle of the c-axis to the substrate surface was observed in a small concentration ratio of $H_2S/TiCl_4$, but there was no definite corelation therebetween. However, the surface flatness strongly depended upon a concentration ratio of $H_2S/TiCl_4$, and flat film was obtained in a concentration ratio between 3 and 20.

Figure 6:
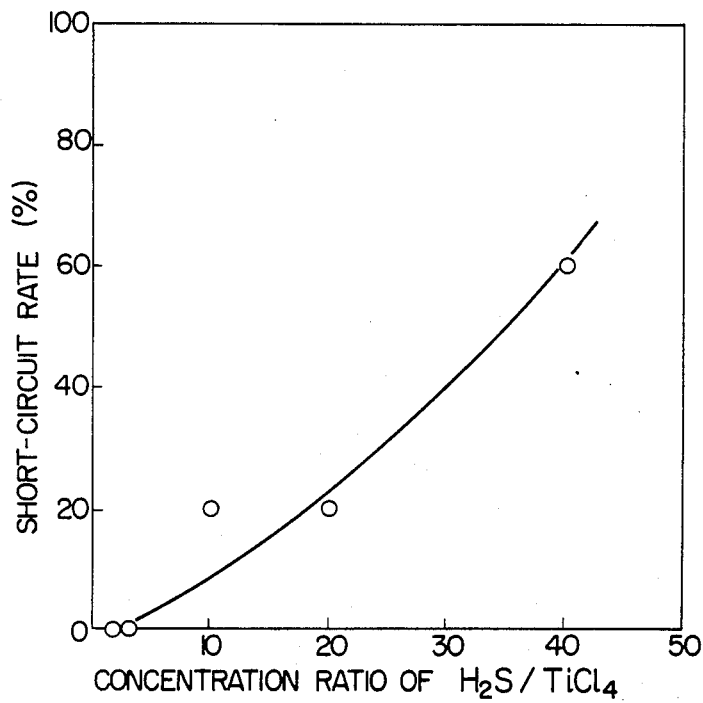
FIG. 6 is a diagram showing a relationship between a concentration ratio of $H_2S/TiCl_4$ and a short-circuit rate.

Batteries were prepared in the same manner as in Example 1, and it was found that all five batteries had no short-circuit in a concentration ratio of $H_2S/TiCl_4$ of 2–3, and only one battery had a short-circuit in a ratio of 10–20, as shown in FIG. 6, whereas among five batteries, three had a short circuit in the concentration ratio of 40. In Example 1, no batteries having a short-circuit was obtained in the concentration ratio of 20, but this difference seems to be due to a difference of carrier gas.

On the other hand, in a concentration ratio of $H_2S/TiCl_4$ of less than 3, a portion of $TiCl_4$ was exhausted as unreacted and there was such an economical disadvantage as a necessary post-treatment for the effluent $TiCl_4$.

To obtain a flat and dense $TiS_2$ film with such an orientation that an angle of the c-axis to the substrate plate is 45° or less with a good economical efficiency, it is necessary that a concentration ratio of $H_2S/TiCl_4$ be 3–20, as in the present invention as described above.

EXAMPLE 5

CVD was carried out with the same apparatus as in Example 1 at the substrate temperature of 550° C., the inner pressure of reaction tube of 0.4 kPa, the $TiCl_4$ flow rate of 5 $\mu l/s$, the $H_2S$ flow rate of 45 $\mu l/s$ and the Ar flow rate of 1.0 ml/s to fabricate a $TiS_2$ film having a film thickness of 20 $\mu m$. The thus obtained $TiS_2$ film had the c-axis of crystallite being substantially in parallel to the substrate surface, i.e. an angle of the c-axis to the substrate surface being 30° or less, and a density of about 75% or higher. The crystallites grew from the substrate to the film surface.

Model batteries were prepared from the thus obtained $TiS_2$ film and subjected to constant current discharge at the current density of 3 $\mu A/cm^2$, whereby a discharge rate of about 80% was obtained. It seems that such a high discharge rate with such a thick film can be obtained owing to a good orientation of crystallites in the the film, good surface flatness and high density.

In the foregoing examples, quartz was used as the substrate, but other materials such as silicon, alumina, etc. could be used as a substitute material, in place of the quartz, and a flat and dense $TiS_2$ film of the present invention could be fabricated thereon.

According to the present invention, a flat and dense $TiS_2$ film on which a film of other material, such as an oxide film, is formable, can be fabricated on various materials. Thus, a film for a device using $TiS_2$ as a constituent can be prepared by application of the present invention, and furthermore a thin film lithium secondary battery using a $TiS_2$ film as a cathode film is prepared on silicon, from which a solar cell has been prepared in advance, to form a novel combined device for storing the solar cell energy.

When a thin film lithium secondary battery is formed on a volatile memory chip, the memory chip can be made non-volatile. By application of the present invention, a novel thin film device or their combined devices can be prepared.

The present TiS$_2$ film can be utilized in a film battery such as the said thin film lithium battery, etc., and is also applicable as an anti-corrosive film.

What is claimed is:

1. A titanium disulfide film fabricated by chemical vapor deposition on a substrate, which comprises crystallites of titanium disulfide each being oriented at an angle of its c-axis to the substrate surface of not more than 45° on average.

2. A titanium disulfide film according to claim 1, wherein the titanium disulfide film has a film density of 70% or higher.

3. A process for fabricating a titanium disulfide film on a substrate, which comprises forming a titanium disulfide film in which crystallites of titanium disulfide are oriented at an angle of their c-axis to the substrate surface of not more than 45° on average on a substrate from titanium tetrachloride and hydrogen sulfide as source gases by chemical vapor deposition under an inner pressure of a reaction system, for forming the titanium disulfide, of 30 kPa or less and at a substrate temperature of 350°–650° C.

4. A process according to claim 3, wherein a concentration ratio of the hydrogen sulfide to the titanium tetrachloride is in a range of 3–20.

5. A process according to claim 3, wherein He or Ar is used as a carrier gas for the titanium tetrachloride and the hydrogen sulfide.

6. A process according to claim 3, wherein the substrate temperature is in a range of 420°–600° C.

7. A titanium disulfide film according to claim 1, wherein the titanium disulfide film has a thickness of from 1 μm to at least 10 μm and flatness such that a difference in the level on a surface of the film must be less than 0.5 μm from the level of an average film thickness.

8. A titanium disulfide film according to claim 1, wherein the substrate is made of a material selected from the group consisting of quartz, silicon and alumina.

9. A process according to claim 3, wherein said reaction system comprises a reaction tube in which the substrate is located and a mixture of the source gases is introduced into the reaction tube to effect chemical vapor deposition of the titanium disulfide film onto the substrate heated to said substrate temperature.

10. A process according to claim 9, wherein the mixture of titanium tetrachloride and hydrogen sulfide source gases has a concentration ratio of H$_2$S/TiCl$_4$ of from 3 to 20.

11. A titanium disulfide film according to claim 1, wherein the crystallites in the titanium disulfide film are oriented to an angle of their c-axis to the substrate surface of not more than 30°.

12. A process according to claim 4, wherein He or Ar is used as a carrier gas for the titanium tetrachloride and the hydrogen sulfide.

13. A titanium disulfide film according to claim 1, wherein each of said crystallites are of a size such that it extends from the substrate surface to the film surface.

14. A process according to claim 3, wherein the inner pressure of the reaction system is 1.5 kPa or less.

15. A titanium disulfide film fabricated on a substrate according to claim 8, wherein said substrate is made of silicon.

* * * * *